(12) United States Patent
Papaefthymiou et al.

(10) Patent No.: US 7,355,454 B2
(45) Date of Patent: Apr. 8, 2008

(54) ENERGY RECOVERY BOOST LOGIC

(75) Inventors: Marios C. Papaefthymiou, Ann Arbor, MI (US); Visvesh S. Sathe, Ann Arbor, MI (US); Conrad H. Ziesler, Los Gatos, CA (US)

(73) Assignee: The Regents of the University of Michigan, Ann Arbor, MI (US)

( * ) Notice: Subject to any disclaimer, the term of this patent is extended or adjusted under 35 U.S.C. 154(b) by 210 days.

(21) Appl. No.: 11/153,135

(22) Filed: Jun. 15, 2005

(65) Prior Publication Data

US 2006/0082387 A1    Apr. 20, 2006

Related U.S. Application Data

(60) Provisional application No. 60/579,711, filed on Jun. 15, 2004.

(51) Int. Cl.
*H03K 19/094* (2006.01)
*H03K 19/0175* (2006.01)

(52) U.S. Cl. ............... 326/93; 326/68; 326/98; 327/109; 327/333

(58) Field of Classification Search .......... 326/63, 326/68, 82–83, 93, 95, 98; 327/129–130, 327/333, 108–109
See application file for complete search history.

(56) References Cited

U.S. PATENT DOCUMENTS 5,396,527 A * 3/1995 Schlecht et al. ............ 377/57
5,504,441 A * 4/1996 Sigal ............................ 326/93
5,675,263 A * 10/1997 Gabara ......................... 326/97
5,701,093 A * 12/1997 Suzuki ......................... 326/98
5,841,299 A * 11/1998 De ............................... 326/98
5,986,476 A * 11/1999 De ............................... 326/98
6,009,021 A * 12/1999 Kioi ....................... 365/189.06
6,433,586 B2 * 8/2002 Ooishi ......................... 326/93
7,005,893 B1 * 2/2006 Athas et al. .................. 326/96
2003/0189451 A1   10/2003 Ziesler et al.

OTHER PUBLICATIONS

Maksimovic et al. "Integrated Power Clock Generators for Low Energy Logic" IEEE Annual Power Electronics Specialists Conference Jun. 18-22, 1995, New York, NY pp. 61-67.*
Moon et al; "An Efficient Charge Recovery Logis Circuit" IEICE Transaactions on Electronics, Electronics Society, okyo, Japan vol. E79-C, No. 7, Jul. 1988, pp. 925-933.
Maksimovic et al.; "Integrated Power Clock Generators For Low Energy Logic" Power Electronics Specialists Conference, 1995; 26th Annual IEEE, Jun. 18-22, 1995, New York, NY, vol. 1, pp. 61-67.
International Search Report, no date.

* cited by examiner

*Primary Examiner*—Rexford Barnie
*Assistant Examiner*—Jason Crawford
(74) *Attorney, Agent, or Firm*—Lempia Braidwood LLC

(57) ABSTRACT

A boost circuit is disclosed that includes a plurality of transistors connected between complementary phases of a clock signal. The boost circuit further includes a first electrical node connected between at least two of the plurality of transistors wherein the plurality of transistors are configured to generate a second voltage from a first voltage at the electrical node in response to the clock signal.

47 Claims, 4 Drawing Sheets

ENERGY RECOVERY BOOST LOGIC

CROSS-REFERENCE TO RELATED APPLICATIONS

This application claims priority based on U.S. Provisional Patent Application No. 60/579,711, filed Jun. 15, 2004, the entirety of which is incorporated herein by reference.

GOVERNMENT GRANTS

This invention was made with government support of grant N66001-02-C-8059 for Prime Contractor DARPA and ARO Grant DAADA 19-03-1-0122. The government has certain rights in the invention.

BACKGROUND

With increasing demands for faster processing capabilities in electronics such as computers, cell phones, and personal digital assistants (PDA's), minimizing energy dissipation has become a primary concern for integrated circuit design. In fact, due to size, space, and heat constraints, energy dissipation is increasingly becoming a limiting factor for high speed digital design.

Current trends to minimize active energy dissipation (i.e., the energy dissipated when transistors are switching) include varying the size of the transistors in a circuit, using a multiple-threshold design (e.g., providing low threshold transistors in critical paths), clock gating (e.g., shutting down the clock in portions of the circuit), and frequency scaling (e.g., slowing down the clock rate). In conjunction with varying the size of the transistors, an effective method for reducing the energy consumption in an integrated circuit is to scale down the supply voltage of the transistors. Scaling the supply voltage advantageously reduces the energy dissipation in the circuit because the energy consumption increases with the square of the supply voltage. As the supply voltage decreases, however, noise margins decrease and the integrated circuit becomes prone to malfunction. In addition, voltage scaled transistors have reduced drive capability, which results in slower operation. Therefore, the embodiments disclosed hereinafter were developed in light of these and other drawbacks.

SUMMARY

A boost circuit including a plurality of transistors connected between complementary phases of a clock signal is provided. The boost circuit includes a first electrical node connected between at least two of the plurality of transistors. The transistors are configured to generate a second voltage from a first voltage at the electrical node in response to a clock signal.

DETAILED DESCRIPTION

An energy recovery boost logic (ERBL) gate for minimizing energy dissipation is provided. Generally, ERBL gates are cascaded together onto an integrated circuit, or "chip." A typical ERBL gate includes a logic evaluation circuit, and a boost circuit. The logic circuit includes one or more evaluation blocks comprising a plurality of transistors configured to implement logical functions like AND, NAND, OR, NOR, IDENTITY and NOT. The evaluation blocks are connected to a dual-rail scaled-down DC supply voltage through one or more control transistors that are configured to collectively control the activation stage of the logic circuit. The boost circuit includes a plurality of transistors configured to recover energy from a logic circuit and to provide a "boost" to a subsequent logic circuit by generating a gate overdrive voltage (i.e., a voltage supplied to the gate of a logic circuit that has been "boosted" by the boost circuit to be higher than the logic circuit supply voltage). The transistors in the boost circuit are connected to complementary phases of a clock signal. The complementary clock signals also provide an input into the gate of the control transistors for the logic circuit. By providing both the logic circuit and the boost circuit with complementary phases of the clock signal, the ERBL gate operates according to a "logic" stage, and a "boost" stage. In other words, the logic circuit and the boost circuit are configured to operate in stages according to mutually exclusive intervals of the clock signal. Accordingly, when the logic circuit is activated, the ERBL gate is said to be in a "logic" evaluation stage, and when the boost circuit is active, the logic circuit is tri-stated (i.e., isolated from the rest of the ERBL circuit) and the ERBL gate is said to be in a "boost" stage.

Figures 1, 1A:
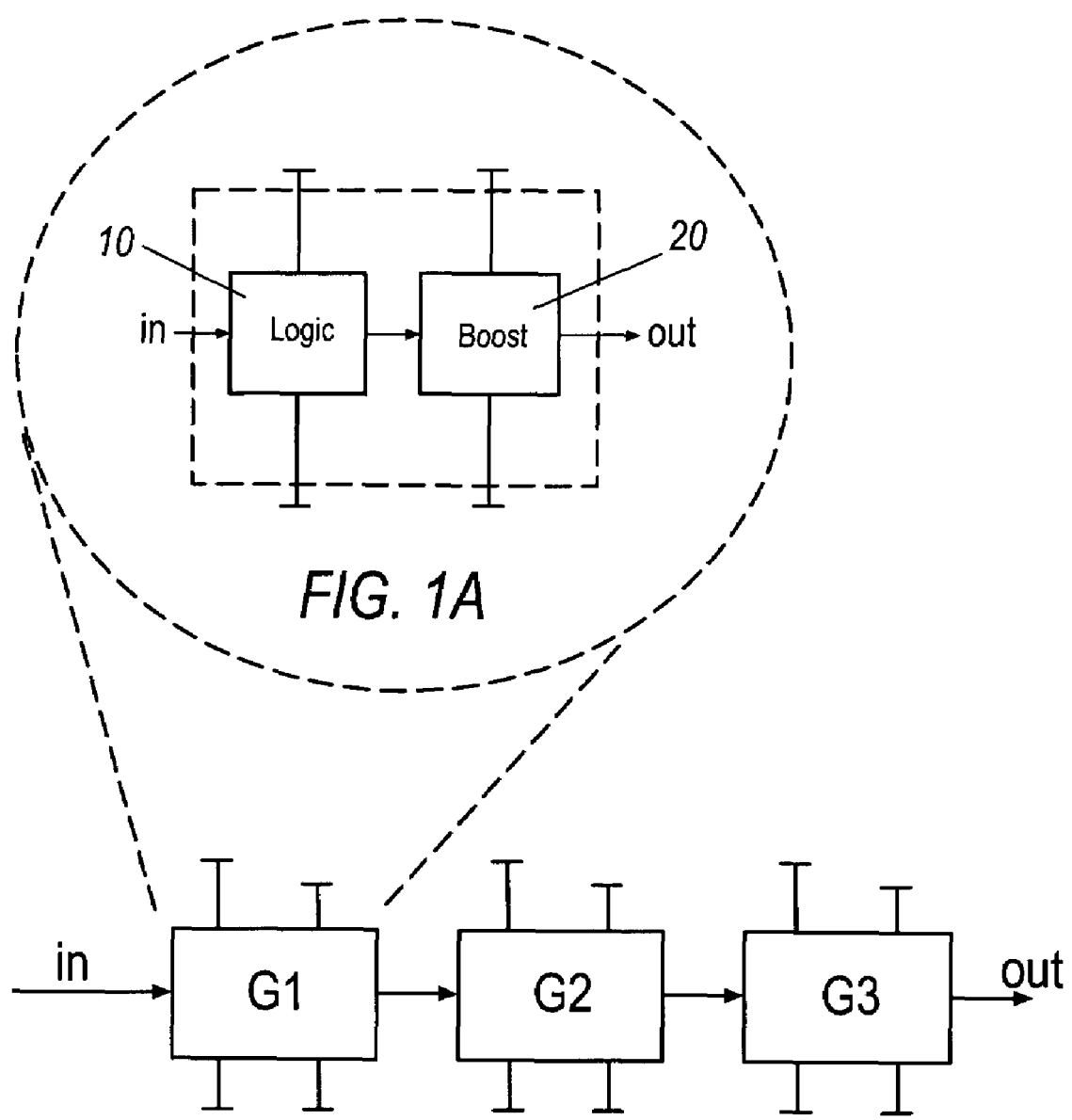
FIG. 1 illustrates a block diagram of a plurality of cascaded energy recovery boost logic (ERBL) gates in an integrated circuit according to an embodiment.
FIG. 1A is a subset of FIG. 1 illustrating the structure of an ERBL gate according to an embodiment.

FIG. 1 illustrates a block diagram of a plurality of energy recovery boost logic (ERBL) gates G1, G2, and G3, cascaded together according to an exemplary embodiment. Each ERBL gate, as illustrated in subset FIG. 1A, includes a logic circuit 10 and a boost circuit 20. The logic circuit 10 can be configured to execute any logical function such as NOT, AND, OR, NAND, IDENTITY, and NOR. The boost circuit 20 is configured to recover the charge from the output of the logic circuit 10 and to provide an overdrive voltage to a subsequent logic circuit when the ERBL gates are in a cascaded sequence. In other words, the boost circuit 20 "boosts" the output voltage from the logic circuit 10 to a predetermined second voltage level. This "boosted" voltage provides an overdrive voltage (higher than the logic circuit 10 supply voltage) to the gate of a subsequent logic circuit 10. Also, the boost circuit 20 recovers energy from the output of the logic circuit 10 by subsequently bringing its voltage back to its un-boosted level.

Figure 2:
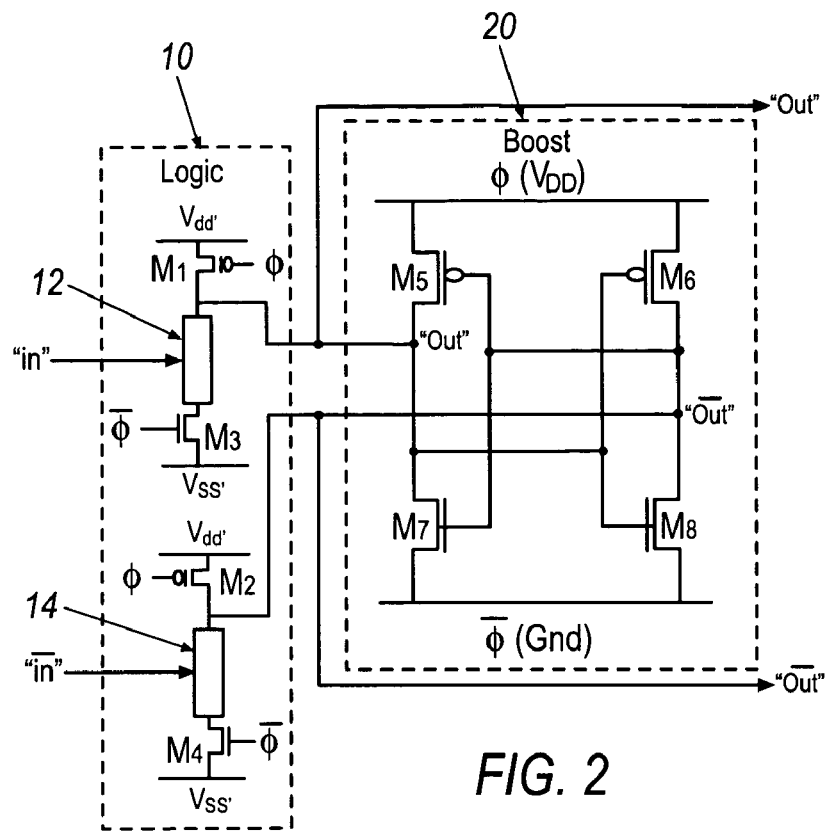
FIG. 2 illustrates a circuit diagram of an energy recovering boost logic gate according to an embodiment.

FIG. 2 is a circuit diagram for an exemplary embodiment of an ERBL gate having a logic circuit 10 and a boost circuit 20. The logic circuit 10 includes two evaluation blocks 12 and 14. One evaluation block 12 evaluates the "true" value of a logic function being executed in the logic circuit 10, and another evaluation block 14 evaluates the "complement" value of a logic function being executed in the logic circuit 10. Although evaluation blocks 12 and 14 of FIG. 2 are intended to represent a general logical function, one of ordinary skill in the art understands that any logic gate (i.e., NOT, AND, OR, NAND, IDENTITY, and NOR gates) can be implemented into evaluation blocks 12 and 14 using combinations of transistors. Each evaluation block 12 and 14 in FIG. 2 is connected to the same low DC supply voltage $V_{dd}'$ through transistors M1 and M2, respectively. Downstream, evaluation block 12 and 14 are connected to DC voltage $V_{ss}'$ through transistors M3 and M4, respectively. Transistors M1 and M2 are pMOS transistors, which turn on in response to a low signal applied to their gate, and transistors M3 and M4 are nMOS transistors, which turn on in response to a high signal applied to their gate. The gates of transistors M1 and M2 are connected to a clock or control signal Φ, which in this case, is a sinusoidal clock signal. One of ordinary skill in the art understands, however, that any periodic trapezoidal clock signal can be applied. The gates of transistors M3 and M4 are connected to $\overline{\Phi}$, which is the complement of the sinusoidal clock signal Φ. The voltage of the sinusoidal clock signal Φ cycles between a nominal voltage of $V_{DD}$ and ground. Nominal voltage $V_{DD}$ is generally greater than supply voltage $V_{dd}'$.

An exemplary boost circuit 20 of the ERBL gate, as shown in FIG. 2, includes four transistors M5, M6, M7, and M8. Transistors M5 and M6 are pMOS transistors, while transistors M7 and M8 are nMOS transistors. The sources of transistors M5 and M6 are connected to sinusoidal clock signal Φ and the sources of M7 and M8 are connected to $\overline{\Phi}$. Downstream from the supply rail providing clock signal Φ, the drains of transistors M5 and M6 are connected to the drains of transistors M7 and M8, respectively. The gates of transistors M6 and M8, and the drains of transistors M5 and M7, are all connected to the output node "out" of the "true" evaluation block 12. In a similar fashion, the gates of transistors M5 and M7, and the drains of transistor M5 and M8, are all connected to the complement output node "$\overline{out}$" of the "complement" evaluation block 14.

Figure 3:
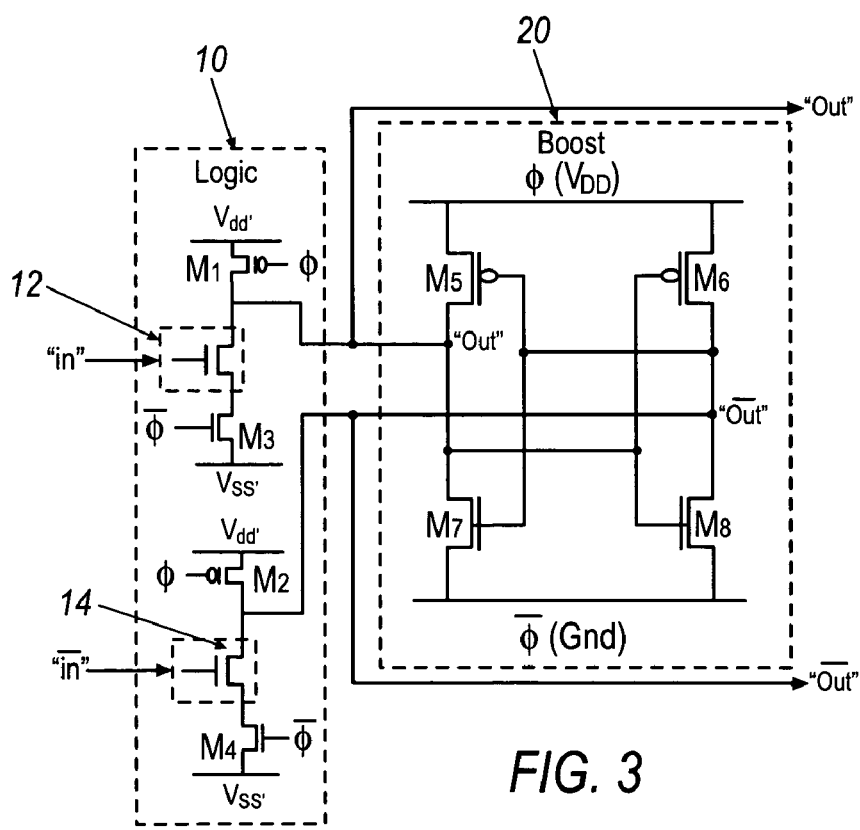
FIG. 3 illustrates a circuit diagram of an ERBL gate according to an embodiment.

The ERBL gate of FIG. 2 includes evaluation blocks 12 and 14, which include one or more transistors configured to execute logical functions. FIG. 3 illustrates an exemplary embodiment of an ERBL gate wherein evaluation blocks 12 and 14 are configured to implement a NOT function (i.e., an inverter). One of ordinary skill in the art understands that evaluation blocks 12 and 14 can be configured to implement any logical function like AND, NAND, OR, IDENTITY, and NOT. The NOT function (hereinafter referred to as an inverter) in FIG. 3 is implemented through evaluation blocks 12 and 14 by transistors M9 and M10. By design, both transistors M9 and M10 are nMOS transistors. Characteristically, pMOS transistors are larger than nMOS transistors and thus have a larger switching capacitance and consume more active energy. By eliminating the use of pMOS transistors in the evaluation blocks, the capacitive loading of the circuit is reduced thereby minimizing the energy dissipation and increasing the operating speed of the ERBL gate.

Figure 4:
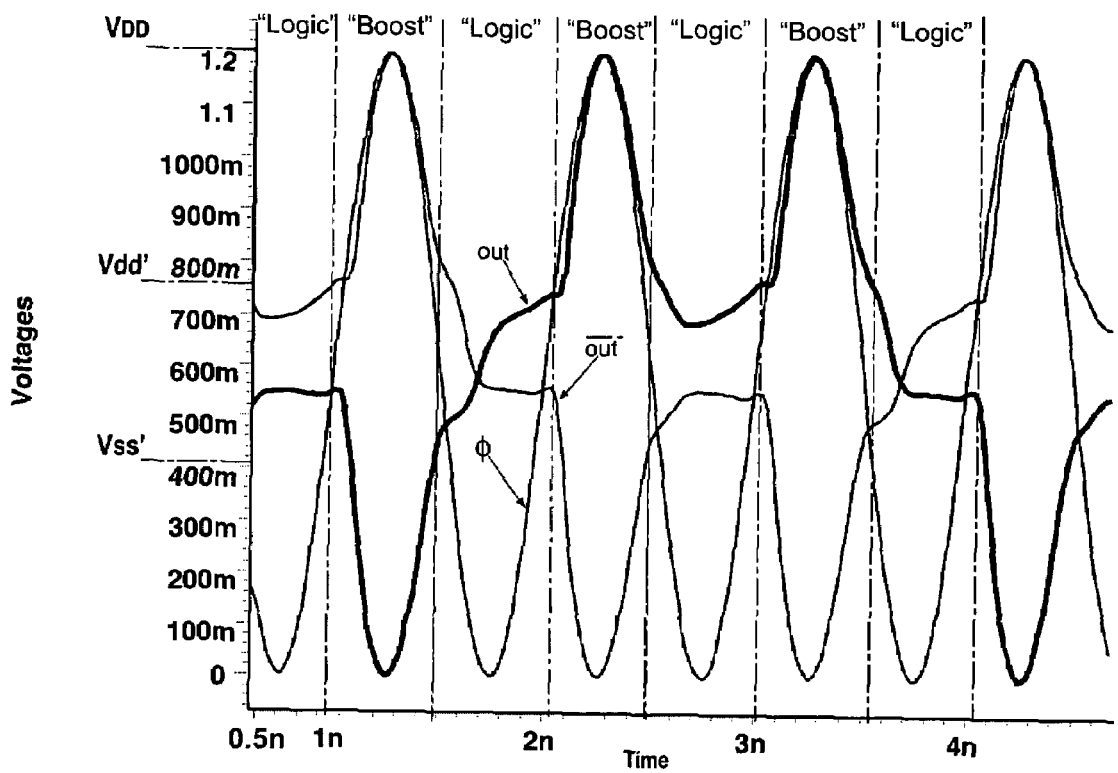
FIG. 4 is a graph illustrating the response of the ERBL gate of FIG. 3.
Figure 5:
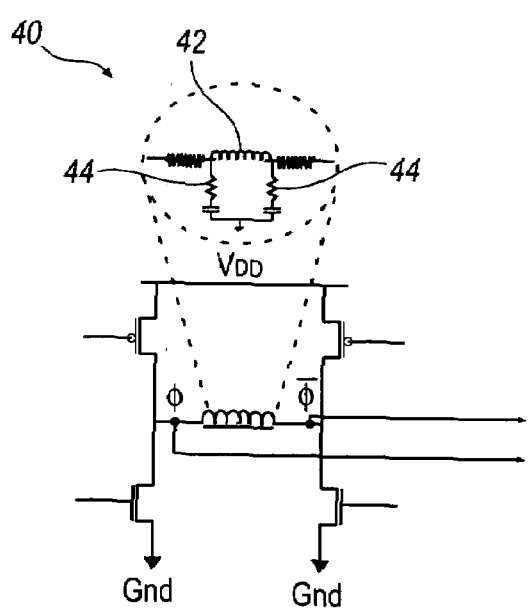
FIG. 5 illustrates an exemplary clock generator.
Figure 6:
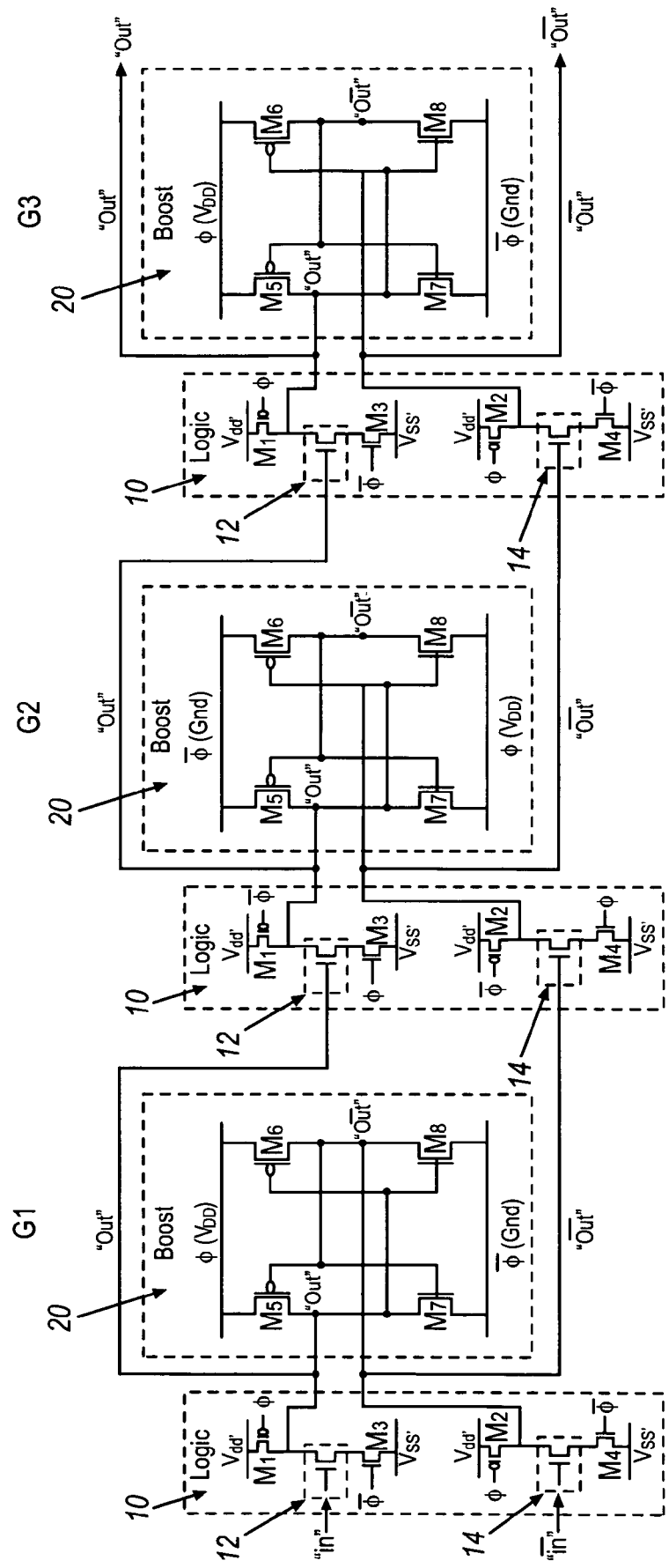
FIG. 6 illustrates another block diagram of a plurality of cascaded energy recovery boost logic (ERBL) gates in an integrated circuit according to an embodiment.

The functionality of an ERBL gate is explained in detail below with reference to FIG. 4 illustrating the response of an ERBL gate. The ERBL gate used for the simulation in FIG. 4 is an inverter ERBL gate as shown in FIG. 3. An input sequence of 1001 at the "in" gate of transistor M9 was used for the simulation shown in FIG. 4. With the exception of slight changes due to the changing input sequence values, the cycles for the ERBL gate are substantially the same. Accordingly, only the first two cycles of input sequence 1001 are discussed below with reference to the operation of the ERBL gate of FIG. 3. The physical representation of input sequence 1001 at the "in" gate is not shown in the graph of FIG. 4. The sinusoidal clock signal Φ, and it complement $\overline{\Phi}$, were simulated at an operating frequency of 1 GHz (cycle time=1 nsec.) using a clock generator 40 as shown in FIG. 5. Clock generator 40 includes an inductor 42 connected to resistors 44, all of which are connected in series to Φ and $\overline{\Phi}$. Clock generator 40 is constructed with a plurality of transistors in an H-bridge configuration to provide complementary phases of Φ that cycle from potential $V_{DD}$ to ground (Gnd). The transistor switches in the H-bridge provide periodic connections to the supply and Gnd to draw additional energy into the ERBL gate which replenishes any energy lost on resistors 44 during the transfer of energy.

Referring now to FIG. 4, at time t=0.5 nsec, the ERBL inverter gate of FIG. 3 begins its first cycle of operation. In this cycle, the inverter computes the inverse of the first input of input sequence 1001, a logical 1. Between time t=0.5 nsec and t=1.0 nsec, the logic circuit of the ERBL inverter gate is active and in a "logic" evaluation stage. This means that the "out" and "$\overline{out}$" nodes are being driven by logic circuit 10. At time t=0.5 nsec, the input nodes "in" and "$\overline{in}$" at evaluation blocks 12 and 14 are at a voltage of approximately $V_{DD}/2$. By the time t=0.75 nsec, the input node "in" is at voltage $V_{DD}$ (a logical "1") and input node "$\overline{in}$" is at voltage 0 (a logical 0). By the time t=1 nsec, the logic circuit 10 has completed its "logic" evaluation stage and has evaluated the logical inverse of 1, pulling the potential of "out" and "$\overline{out}$" apart by $V_C$, which is approximately equal to $V_{dd}'-V_{ss}'$. By design, $V_C$ is also chosen to be approximately equal to $V_{TH}$, which is the threshold voltage for the transistors in both the "logic" stage and the "boost" stage. With respect to the ERBL gate in FIG. 3, all of the transistors have been designed to have the same threshold voltages. In the alternative, ERBL gate circuit performance may be increased by judiciously selecting transistors having lower threshold voltages.

At time t=1 nsec, the ERBL gate transitions into a "boost" stage. During this stage the output nodes "out" and "$\overline{out}$" are driven by boost circuit 20, and the logic circuit 10 is tri-stated. This means that transistors M1, M2, M3, and M4 of logic circuit 10 have been isolated from the rest of the ERBL gate and have been turned "off" as a result of the voltage level of Φ and $\overline{\Phi}$ falling below threshold at time t=1 nsec. In the "boost" stage, the voltage level at the "$\overline{out}$" node tracks the sinusoidal clock signal Φ while the voltage level at the "out" node tracks its complement $\overline{\Phi}$ ($\overline{\Phi}$ is not shown in FIG. 4 but is substantially anti-phase with sinusoidal clock signal Φ). Accordingly, as shown in FIG. 4, the voltage potential between "out" and "$\overline{out}$" is amplified all the way to $V_{DD}$ and then back down to about $V_C$. At the time when t=1.25 nsec, the nodes "out" and "$\overline{out}$" are at their maximum potential of $V_{DD}$. From time t=1.25 nsec to t=1.5 nsec, the voltage at nodes Φ and $\overline{\Phi}$ move from $V_{DD}$ and 0, respectively, towards $V_{DD}/2$. At this point, the energy at output nodes "out" and "$\overline{out}$" is recovered and returned to the sinusoidal clock signal generator of Φ. By the time t=1.5 nsec, the potential at nodes "out" and "$\overline{out}$" is back to about $V_C$. Note that at this point, the voltage potential at "$\overline{out}$" is higher voltage than at "out".

At time t=1.5 nsec, the inverter begins the second cycle in its operation when it evaluates the inverse of the second input of sequence 1001, a logical 0. Between t=1.5 nsec and t=2 nsec, the inverter is again in a "logic" evaluation stage during which output nodes "out" and "$\overline{out}$" are driven by the logic circuit 10. At time t=1.5 nsec, input nodes "in" and "$\overline{in}$" are approximately at voltage $V_{DD}/2$. By time t=1.75 nsec, the input node "in" is at voltage 0 (a logical 0), and the input node "$\overline{in}$" is at voltage $V_{DD}$ (a logical 1). By time t=2 nsec, the logic circuit 10 has evaluated the logical inverse of 0, pulling the potential of "out" and "out" apart by approximately Vc. Notice that in contrast to the first cycle, in this cycle output node "out" is at the higher voltage potential than "out". This is because of the value of the input sequence 1001 has changed from a logical 1 to a logical 0. Notice that between during the third cycle between time t=2.5 nsec and t=3.0 nsec, the voltage at "out" is still higher. This is because there has been no change to the logical value of the input sequence (1001) between cycles two and three (a logical 0 to a logical 0).

Between t=2 nsec and t=2.5 nsec, the inverter is again in a "boost" stage during which output nodes "out" and "out" are driven by the boost circuit 20. The logic circuit 10 is again tri-stated and the voltage at node "out" tracks clock waveform $\Phi$ while the voltage at node "out" tracks $\overline{\Phi}$. Accordingly, the potential between "out" and "out" is amplified all the way to $V_{DD}$ and then back to about Vc. Notice the inversion of polarity in comparison with the "boost" stage of the first cycle, since the gate is now computing a logical 1, as opposed to a logical 0. At time t=2.25 nsec, the nodes "out" and "out" are at their maximum potential $V_{DD}$. By time t=2.5 nsec, the potential at these nodes is back to about $V_C$. From t=2.25 nsec to t=2.5 nsec, as the voltage of clock signal $\Phi$ and $\overline{\Phi}$ moves from $V_{DD}$ and 0, respectively, towards $V_{DD}/2$. At this time, the energy from output nodes "out" and "out" is recovered and returned to the sinusoidal clock generator on virtually the same electrical path from which it originated.

As discussed above, and shown by the block diagram in FIG. 1, ERBL gates G1, G2, and G3 are generally cascaded together so that the boost circuit 20 of one ERBL gate, drives the logic circuit 10 of another ERBL gate. This configuration is shown in FIG. 5 by cascading ERBL gates G1, G2, and G3. In the same way that a logic circuit 10 and a boost circuit 20 operate according to mutually exclusive intervals of the sinusoidal clock signal $\Phi$, adjacent ERBL gates G1, G2, and G3 also operate with respect to one another according to opposite phases of clock signal $\Phi$. For example, note that the sources of transistors M5 and M6 of ERBL gates G1 and G3 are connected to sinusoidal clock signal $\Phi$, while the sources of transistors M5 and M6 of ERBL gate G2 are connected to $\overline{\Phi}$, the complement of clock signal $\Phi$. In addition, the inputs $\Phi$ and $\overline{\Phi}$ to the gates of logic circuit transistors M1, M2, M3, and M4, in ERBL gate G1 and G3, are opposite to the same inputs (transistors M1, M2, M3, and M4) in ERBL gate G2. In this way, when ERBL gates G1 and G3 are in their "logic" evaluation stage (i.e., the logic circuit is "on" and the boost circuit is "off"), ERBL gate G2 is in its "boost" stage (i.e., the boost circuit is "on" and the logic circuit is "off") and vice versa. Further, when gate G1 is in its "boost" stage, the boost circuit of gate G1 is driving the logic circuit 10 of gate G2. It is the energy that is boosted to gate G2 that is later recovered by gate G1 (with reference to FIG. 4, this recovery occurs as a result of $\Phi$ and $\overline{\Phi}$ approaching one another after having been at their respective peak values of $V_{DD}$ and Gnd, respectively).

Although the boost circuit 20 set forth in the foregoing embodiments is configured to work in conjunction with a logic circuit 10 to recover stored energy and overdrive the voltage gates of a downstream logic circuit 10, one of ordinary skill in the art understands the applicability of the boost circuit 20 to other applications. Conceptually, the boost circuit 20 is configured to amplify, or "boost", one incoming lower voltage level to another higher voltage level in an efficient manner by utilizing the complementary phases of $\Phi$ and $\overline{\Phi}$ to charge and discharge the nodes of the boost circuit 20. The complementary phases of $\Phi$ and $\overline{\Phi}$ are utilized in conjunction with a generator such as the one shown in FIG. 5, which has the ability to re-supply charge to the circuit through the use of, for example, an inductor. For this reason, the boost circuit 20, as described in detail above, can be applied to any application in which it is desirable to amplify a lower voltage to a higher voltage without incurring additional substantial energy consumption. Examples of other applications include, but are not limited to, bus circuits (e.g., taking a lower bus voltage to a higher bus voltage), voltage islands (e.g., where interconnected sets of logic gates are taken from one lower voltage to another higher voltage), and differential signaling (e.g., the use of two electrical lines at opposite voltages to denote a logical 1 or a logical 0).

While the present invention has been particularly shown and described with reference to the foregoing preferred embodiment, it should be understood by those skilled in the art that various alternatives to the embodiments of the invention described herein may be employed in practicing the invention without departing from the spirit and scope of the invention as defined in the following claims. It is intended that the following claims define the scope of the invention and that the method and system within the scope of these claims and their equivalents be covered thereby. This description of the invention should be understood to include all novel and non-obvious combinations of elements described herein, and claims may be presented in this or a later application to any novel and non-obvious combination of these elements. The foregoing embodiment is illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements.

The invention claimed is:

1. A boost logic gate with an output node, the boost logic gate comprising:
   a logic circuit configured to implement a logic function and determine a voltage on the output node in accordance with the logic function; and,
   a boost circuit comprising a plurality of transistors connected between a pair of power supply rails to boost the voltage on the output node with either a clock signal or a complementary phase of the clock signal;
   wherein the clock signal and the complementary phase of the clock signal are provided via respective rails of the pair of power supply rails.

2. The boost logic gate according to claim 1, wherein said clock signal is a periodic trapezoidal signal.

3. The boost logic gate according to claim 1, wherein said clock signal is a sinusoidal clock signal.

4. The boost logic gate of claim 1, wherein the logic circuit comprises first and second evaluation blocks responsive to complementary inputs, and wherein the voltage on the output node is driven by the first evaluation block and a voltage on a complementary output node of the boost logic gate is driven by the second evaluation block.

5. The boost logic gate of claim 4, wherein the first and second evaluation blocks utilize NMOS logic.

6. The boost logic gate of claim 1, wherein said plurality of transistors includes:
   a first and a second pMOS transistor; and
   a first and a second nMOS transistor;
   wherein the sources of said first and second pMOS transistors are connected to said clock signal, and the sources of said first and second nMOS transistors are connected to the complement of said clock signal;

wherein the first electrical node is connected to the drain of said first nMOS transistor, the drain of said first pMOS transistor, the gate of said second nMOS transistor, and the gate of said second PMOS transistor.

7. The boost logic gate of claim 1, wherein said plurality transistors are low threshold transistors.

8. The boost logic gate according to claim 1, wherein the logic circuit is configured to determine the voltage on the output node in accordance with the clock signal.

9. The boost logic gate according to claim 1, in combination with a clock generator to provide the clock signal or the complementary phase of the clock signal to one of the power supply rails, wherein the clock generator is configured to recover and return charge provided to one of the power supply rails via the clock signal or the complementary phase of the clock signal.

10. A boost logic gate with an output node, the boost logic gate comprising:
a logic circuit configured to implement a logic function and determine a voltage on the output node in accordance with the logic function; and,
a boost circuit comprising a plurality of transistors connected between a pair of power supply rails to boost the voltage on the output node with either a clock signal or a complementary phase of the clock signal;
wherein the clock signal or the complementary phase of the clock signal is provided via one of the power supply rails, and wherein the logic circuit and the boost circuit are coupled to the clock signal or the complementary phase of the clock signal such that the logic circuit and the boost circuit drive the voltage on the output node during mutually exclusive time intervals within a cycle of said clock signal.

11. The boost logic gate according to claim 10, wherein the plurality of transistors comprise two pairs of cross-coupled transistors connected between the clock signal and the complementary phase of the clock signal.

12. A boost logic gate with an output node, the boost logic gate comprising:
a logic circuit configured to implement a logic function and determine a voltage on the output node in accordance with the logic function, wherein the logic circuit comprises first and second evaluation blocks responsive to complementary inputs, and wherein the voltage on the output node is driven by the first evaluation block and a voltage on a complementary output node of the boost logic gate is driven by the second evaluation block; and,
a boost circuit comprising a plurality of transistors connected between a pair of power supply rails to boost the voltage on the output node with either a clock signal or a complementary phase of the clock signal;
wherein the clock signal or the complementary phase of the clock signal is provided via one of the power supply rails, and wherein each of the first and second evaluation blocks are coupled to a pair of DC supply rails having a voltage differential scaled down from a maximum voltage differential reached between the pair of power supply rails for the boost circuit.

13. An integrated circuit comprising:
a boost circuit including a plurality of transistors connected between complementary phases of a clock signal;
a logic circuit comprising a plurality of transistors connected between a first supply voltage and a second supply voltage, said plurality of transistors are configured to switch "on" or "off" in response to said complementary phases of said clock signal, said logic circuit is connected to said boost circuit by a first electrical node;

wherein said boost circuit is configured to generate a second voltage from a first voltage at said first electrical node in response to said clock signal.

14. The integrated circuit according to claim 13, wherein said second voltage is greater than said first voltage.

15. The integrated circuit according to claim 13, wherein said clock signal is a periodic trapezoidal signal.

16. The integrated circuit according to claim 13, wherein said clock signal is a sinusoidal clock signal.

17. The integrated circuit according to claim 13, further including a clock generator for providing said complementary phases of said clock signal.

18. The integrated circuit according to claim 17, wherein said clock generator is capable of returning a charge recovered through said complementary phases of said clock signal.

19. The integrated circuit of claim 13, wherein the voltage at said first electrical node varies over time from said first voltage to said second voltage, and back to said first voltage in response to said clock signal.

20. The integrated circuit of claim 13, wherein said complementary clock signals provide a return path for the recovery of charge as the voltage at said first electrical node changes between said first and second voltages.

21. The integrated circuit of claim 13, further including a second electrical node connected between at least two of said plurality of transistors in said boost circuit, the voltage at said second node being the complement of the voltage at said first electrical node.

22. The integrated circuit of claim 13, wherein said boost circuit and said logic circuit operate at mutually exclusive intervals in response to said clock signal.

23. The integrated circuit of claim 13, wherein said logic circuit includes a first evaluation block and a second evaluation block.

24. The integrated circuit of claim 23, wherein said first and second evaluation blocks comprise a plurality of transistors configured to represent one of the following boolean logic gates: AND, NAND, OR, NOR, IDENTITY and NOT.

25. The integrated circuit of claim 23, wherein said first and second evaluation blocks perform complementary logic functions.

26. The integrated circuit of claim 23, wherein said first and second evaluation blocks are connected to said first and second supply voltages by at least one pMOS transistor and at least one nMOS transistor.

27. The integrated circuit of claim 26, wherein the gates of said at least one pMOS transistor and at least one nMOS transistor are connected to said complementary phases of said clock signal.

28. The integrated circuit of claim 13 wherein said plurality of transistors in said boost circuit include a first and a second pMOS transistor, and a first and a second nMOS transistor, the sources of said first and second pMOS transistors being connected to said clock signal, the sources of said first and second nMOS transistors being connected to the complement of said clock signal.

29. A method for reducing energy dissipation in an integrated circuit, comprising:
implementing a logic function to determine a voltage on an output node in accordance with a clock signal;

providing the clock signal or a complementary phase of the clock signal at a power supply rail of a boost circuit coupled to the output node; and boosting the voltage on the output node with either the clock signal or a complementary phase of the clock signal.

30. The method according to claim 29, wherein the clock signal is a sinusoidal clock signal.

31. The method according to claim 29, wherein the implementing step and the boosting step are performed during mutually exclusive intervals of said clock signal.

32. The method according to claim 29, further comprising recovering energy at the output node involved in the implementing step via the clock signal or the complementary phase of the clock signal.

33. The method according to claim 32, further comprising returning the recovered energy via the clock signal or the complementary phase of the clock signal to the power supply rail of the boost circuit.

34. A system for reducing dissipated energy in an integrated circuit, comprising:
a means for evaluating a logical function in a logic circuit;
a means for recovering energy dissipated by said logic circuit; and
a means for boosting the recovered dissipated energy from a first voltage to a second voltage in response to a control signal.

35. A boost circuit, comprising:
a plurality of transistors; and
a first electrical node connected to a second electrical node by at least one of said plurality of transistors;
wherein said plurality of transistors are configured to generate a second voltage from a first voltage at said first electrical node by transferring charge from said second electrical node to said first electrical node in response to a change in voltage at said second electrical node.

36. The boost circuit according to claim 35, wherein said plurality of transistors are configured to generate a third voltage at said first electrical node by transferring charge from said first electrical node to said second electrical node in response to a change in the voltage at said second electrical node.

37. The boost circuit according to claim 36, wherein said changes in the voltage at said second node comprise a sequence of trapezoidal pulses.

38. The boost circuit according to claim 36, wherein said changes in the voltage at said second node are sinusoidal.

39. The boost circuit according to claim 36, wherein said third voltage at said first electrical node is approximately equal to said first voltage at said first electrical node.

40. The boost circuit according to claim 35, further comprising a clock generator for providing voltage to said second node.

41. The boost circuit according to claim 40, wherein said clock generator is capable of returning to said first electrical node, the charge that was transferred from said first electrical node to said second electrical node.

42. The boost circuit according to claim 35, further comprising a third electrical node connected to said second electrical node by at least one transistor, the voltage at said third electrical node being the complement of the voltage at said first electrical node.

43. The boost circuit according to claim 42, further comprising a fourth electrical node connected to said first and third electrical nodes by said plurality of transistors, the voltage at said fourth electrical node being the complement of the voltage at said second electrical node.

44. The boost circuit according to claim 43, wherein said plurality of transistors includes a first and a second PMOS transistor and a first and second nMOS transistor, the sources of said first and second pMOS transistors are connected to said second node and the sources of said first and second nMOS transistors are connected to said fourth node.

45. The boost circuit according to claim 44, wherein said first node is connected to the drain of said first pMOS transistor, the drain of said first nMOS transistor, the gate of said second PMOS transistor and the gate of said second nMOS transistor.

46. The boost circuit according to claim 44, wherein said third node is connected to the drain of said second pMOS transistor, the drain of said second nMOS transistor, the gate of said first PMOS transistor and the gate of said first nMOS transistor.

47. The boost circuit according to claim 35, wherein said plurality of transistors are low threshold transistors.

* * * * *